Figure 1:
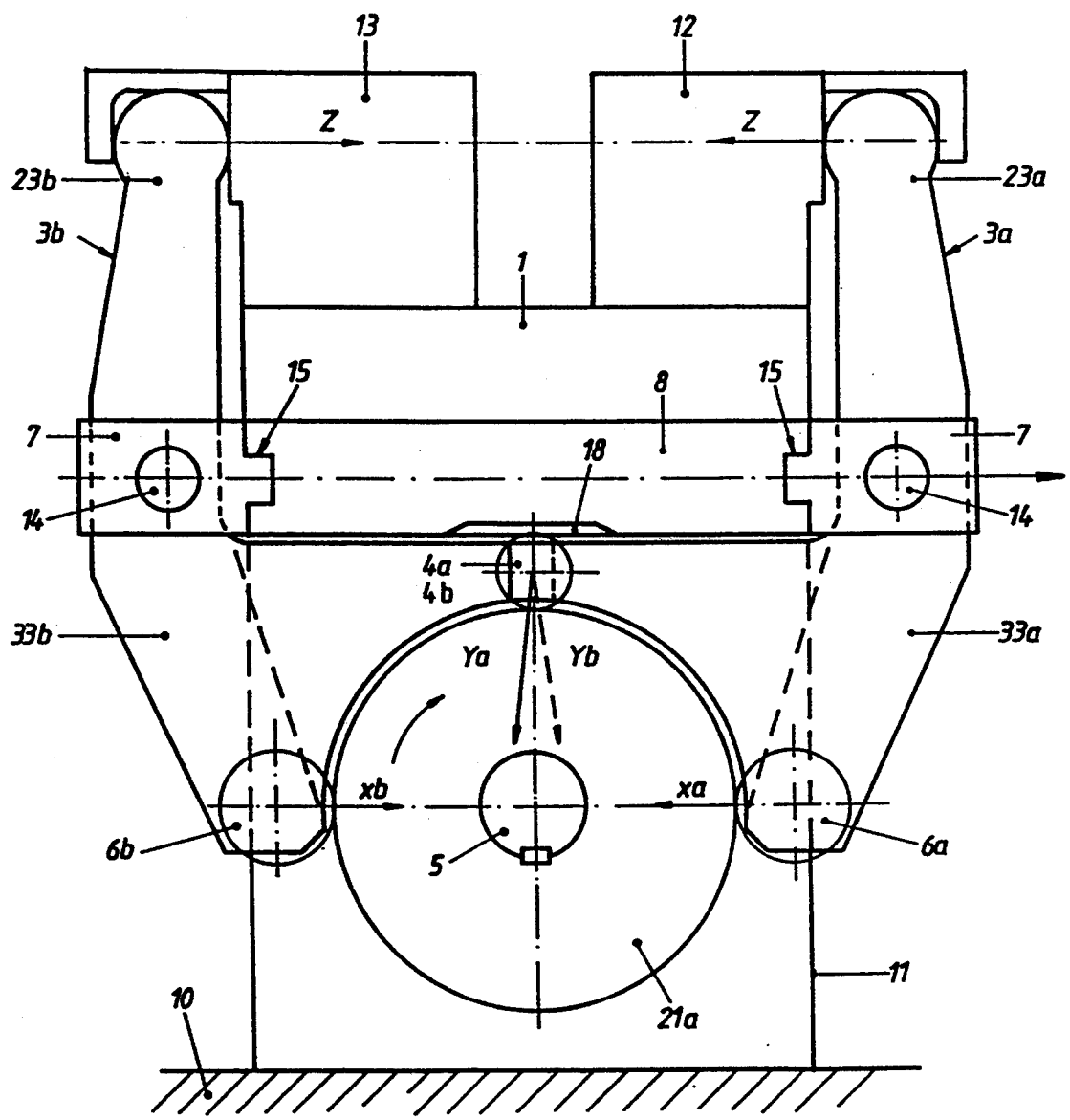

United States Patent [19]

Hinterlechner et al.

[11] Patent Number: 5,428,982
[45] Date of Patent: Jul. 4, 1995

[54] MACHINE TOOL WITH CAM GEAR, IN PARTICULAR FOR PUNCHING AND SHAPING THE LEAD-OUTS OF INTEGRATED CIRCUITS

[75] Inventors: Gerhard Hinterlechner, Pforzheim; Ulrich H. Gäbel, Neuenbürg, both of Germany

[73] Assignee: AATEC Assembling Automations Technik GmbH, Pforzheim, Germany

[21] Appl. No.: 182,140
[22] PCT Filed: Jun. 27, 1992
[86] PCT No.: PCT/EP92/01450
§ 371 Date: Jan. 14, 1994
§ 102(e) Date: Jan. 14, 1994
[87] PCT Pub. No.: WO93/02540
PCT Pub. Date: Feb. 4, 1993

[30] Foreign Application Priority Data
Jul. 16, 1991 [DE] Germany .................... 41 23 512.6
[51] Int. Cl.⁶ .................... B21D 28/00; B21J 7/20
[52] U.S. Cl. .................... 72/408; 72/452; 74/569
[58] Field of Search .................... 72/408, 452; 83/602; 74/569, 54

[56] References Cited

U.S. PATENT DOCUMENTS 1,260,260  3/1918  Harmon .................... 74/569
5,055,001  10/1991  Natwick .................... 74/54

FOREIGN PATENT DOCUMENTS 0226136  6/1987  European Pat. Off. .
275036   5/1979  Germany .
3103525  8/1982  Germany .
3544087  6/1987  Germany .
933433   8/1963  United Kingdom .

*Primary Examiner*—Daniel C. Crane
*Attorney, Agent, or Firm*—Dvorak and Traub

[57] ABSTRACT

The machine tool has a frame (10) and in it, a cam gear with two pairs of cam tracks with complementary curve shapes. The tool actuation takes place by means of two levers (3a, 3b) which are hinged to the side on a clamping plate (8). Each of these levers has two rollers (4a, 6a; 4b, 6b) on one of its arms and these are coupled positively to one cam track pair each.

31 Claims, 5 Drawing Sheets

MACHINE TOOL WITH CAM GEAR, IN PARTICULAR FOR PUNCHING AND SHAPING THE LEAD-OUTS OF INTEGRATED CIRCUITS

This application is a 371 of PCT/ET92/01450, filed Jun. 27, 1992.

FIELD OF THE INVENTION

The invention is based on a machine tool with cam gear, particularly for punching and shaping the lead-outs of integrated circuits.

STATE OF THE ART

Such a machine is known from DE-PS 35 44 087. In the known machine, the tools are driven by a cam gear which has two driven cam plates located on the same axis. A freely rotating roller is in contact with the circumferential area, designed as the cam track, of each of the two cam plates. Each of the two rollers is supported at the end of a two-am lever which transmits the deflection of the roller caused by the rotating cam track to a tool half, or to a holder for it, which is located at the opposite end of the lever. The two levers are connected together by a tie-rod on whose ends the two levers are pivotably supported.

So that the rollers remain continuously in contact with the cam plates, they are pressed or pulled by frictional connection onto the cam track formed by the circumferential surface of the cam plate; this is generally effected by springs. The preload forces applied by the springs must be larger than the forces arising during the acceleration and braking of the tools in order to ensure that the rollers do not lift from the cam plates. A disadvantage of these preloading forces, on the other hand, is that they make the drive more difficult because they have to be overcome when the tools are driven so that a correspondingly strong and heavy driving motor is required. Another disadvantage arises from the fact that the torque to be provided by the driving motor for the actual operating process carried out by the tools is increased by the torque which is required to overcome the preloading forces acting on the rollers; in consequence, the response threshold of an overload clutch provided in the drive train to protect the tools from damage in the case of overload has to be increased in an undesirable manner. Another disadvantage consists in the fact that a device for preloading the rollers by springs prevents a displacement of the lever, desirable per se, parallel to the driving shaft of the cam plate; such a displacement capability is desirable to adapt the machine tool for different operational tasks.

In order to avoid the preloading forces, it is known art to guide the roller in a groove on the cam plate (grooved cam gear) or to guide a pair of rollers on both sides of a bead on the cam plate (beaded cam gear) instead of on the circumferential surface of the cam. For the same follower motions as those of a cam gear in which the roller runs externally on the circumferential surface of the cam plate, however, grooved cam plates and beaded cam plates have a larger diameter so that larger inertia torques appear in the cam gear. This is undesirable because the machine can only be stopped more slowly or the driving forces and braking forces become larger and wear increases. The acceleration and braking forces of the tool halves and the clamping devices carrying them generally appear in the direction of the tool motion. They are particularly disadvantageous in the case of a rapid reversal of acceleration because the inertia forces due to the tools and gear elements appearing in the direction of the tool motion excite the machine frame and the work-piece holder to vibrations, in some cases at a high excitation frequency. In order to counter the excitation of vibration, it is known art to displace the apex of the reversal of acceleration in the direction of the starting acceleration so that the braking deceleration is reduced—but with the disadvantage that the starting acceleration is increased.

In DE-PS 35 44 087, there is, furthermore, an indication that the return of the tools can be controlled by cams or cam plates but without positive information on how this has to be done and whether it has an influence on the vibration behaviour.

The disadvantages mentioned are particularly serious in the case of machines for punching and shaping the lead-outs of integrated circuits because this work must, on the one hand, be carried out with great accuracy, particularly in the case of printed circuits which have many lead-outs because of a high integration density. On the other hand, a rapid working cycle is desirable for low-cost manufacture but factors opposing this are inertia, the tendency to vibration and an increase in wear. The tendency to vibration is particularly serious because the punching and shaping work on the delicate lead-outs can only be carried out with the desired precision if the integrated circuits sit quietly and the tools do not vibrate. These conditions must similarly be met if the machine tool is to be controlled and monitored by means of a camera for pattern recognition and pattern measuring devices. The integrated circuits which, initially, are still suspended with their lead-outs in pre-punched metal strips (so-called lead frames), tend to vibrate when the lead-outs are separated from the lead frame in one operational step and the integrated circuits are then further processed suspended in the lead frame on only four thin bridges.

DESCRIPTION OF THE INVENTION

The object of the present invention is so to arrange the tool driven in a machine tool of the type mentioned at the beginning, in particular in a machine for punching and shaping the lead-outs of integrated circuits, that it can be operated with small inertia torques by means of low drive torques and braking torques and, at the same time, the tendency to excite vibrations of the tool holder (clamping plate) and the frame is reduced.

In the machine according to the invention, the rollers of the two levers respectively run externally on an external curve track on the circumferential surface of at least one cam plate but the contact between the cam track and the roller is not ensured by mechanical preload by means of a spring but by the fact that each cam track is associated with a second cam track rigidly connected to it, the cam profile of this latter cam track being complementary to the first cam track, and that each of the two levers carries on one of its arms not only one freely rotating roller but two freely rotating rollers which are offset relative to one another in the peripheral direction of the cam track and, in fact, preferably at a 90° position relative to one another relative to the axis of the cam tracks. Of these two rollers, one roller rolls on one cam track and the other rolls on the second cam track complementary to the first, this second cam track having a corresponding offset relative to the first cam track. Because of the complementary configuration of the cam tracks, it is possible—without preloading forces—to force the two rollers of a lever to have continuous contact with their cam track pair. The advantage of this arrangement is that for a given follower motion, the smallest possible cam plates can be used and, because of this, the inertia torque is low. It is also possible to keep the drive torques small because preloading springs are avoided. The vibration amplitude to which the machine is excited is correspondingly small.

The second rollers are located with their axes near to (and preferably on) a normal to the direction of motion Z of the tool halves and passing through the axis of the cam tracks. The use of two rollers offset relative to one another in the selected arrangement for each lever has the great advantage that the forces occurring during acceleration and braking are no longer introduced exclusively parallel to the direction of motion of the tool in the machine frame but are divided into two directions. The acceleration forces during the return motion (idling stroke)—which are particularly critical to the excitation of vibrations—and the braking forces during the working stroke are deflected, in accordance with the invention, in a direction extending transverse to the tool motion. The starting acceleration during the working stroke and the braking deceleration during the idling stroke, on the other hand, occur in the direction of the tool motion. The tendency to excite vibration and the vibration frequency are reduced by the division of the forces into different directions. This is particularly so in the preferred case such that the guide device for the tools, which is preferably a plate or a block, or a clamping plate carrying them, extends horizontally and, in consequence, the tool motion also takes place horizontally and the two first rollers of the two levers are correspondingly supported in a plane parallel to the guide device or to the tool clamping plate under the latter; in this case, the two rollers of the lever conduct a substantial part of the forces downwards into the frame and into the machine foundation so that a resultant force directed obliquely to the tool motion is introduced to the frame at the bearings of the two levers during the acceleration phase in the idle stroke and during the braking phase in the working stroke. That part of the forces which is introduced downwards into the frame and into the foundation causes less excitation of machine vibrations due to the mass of the frame and the foundation. The machine is therefore characterised by very smooth running, which is an important advantage in view of the high accuracy requirements in the micro-engineering. Smooth running is also a condition for high working speeds. At the same time, smooth running means less wear and permits the use of a camera for pattern recognition and pattern measurement.

It is useful for the stationary part of the cam gear, on which the levers are supported, to be a tie-rod. The tie-rod is preferably formed by the tool clamping plate itself. This has the advantage that the clamping plate is only subjected to tension. It is therefore not deformed during the press and printing operations but is, on the contrary, stretched by the tensile forces. This is very beneficial to precise support of the workpieces to be processed and to precise guidance of the tools, which is a substantial advantage in micro-engineering processing such as is necessary on micro-electronic components.

The fact that the lever is hinged near the tools, preferably directly at the clamping plate, has the further advantage that an optimally compact tool and gear arrangement is possible and this is further supported by the fact that in accordance with the invention, the second roller of each lever is located near the tools, preferably close below the clamping plate or even in a recess of the clamping plate. In consequence, the levers are very short and have low inertia.

In accordance with a further preferred feature of the invention, the second roller of each lever, which is located in the immediate vicinity of the tools or of the clamping plate, is smaller than the first roller. This is possible because it does not have to transmit the higher processing forces because these are transmitted from the two other first rollers located diametrically opposite to one another.

Because the second roller can be smaller, it is possible to bring the cam tracks closer to the clamping plate. This is associated with a corresponding shortening of the two levers which is again favourable with respect to reducing the inertia. The low inertia, in combination with the drive via complementary cam tracks, has the result that a smaller drive torque is sufficient for the acceleration. This is lower than the pure processing torque so that it is possible to provide an overload clutch in the drive train with a correspondingly lower response threshold. In addition, each reduction in the drive torques reduces the forces which can lead to the excitation of vibrations.

Clearance-free coupling between the lever which actuates the tools and the cam tracks is also of importance to low-vibration, precise operation of the tools. The drive of the tools by means of complementary cam tracks again proves satisfactory in this connection, each of the tracks being followed by two rollers offset relative to one another in the peripheral direction on one arm of a two-arm lever. Particularly small clearance in the coupling between the levers and the cam tracks is, in fact, achieved by a further development of the invention in accordance with which the arm of the lever carrying the rollers is branched into a main arm, which carries the first roller, and an auxiliary arm, which is weaker relative to the first roller and carries the second roller. The auxiliary arm can be made weak because it only has to transmit the forces necessary for the return of the tools (idle stroke) and these forces are very much less than the forces which the main arm has to transmit during the working stroke. Whereas the main arm has to be rigid, measured against the forces occurring, the auxiliary arm can be so weak relative to them that when the rollers are placed on the cam tracks with some pressure, it bends elastically. In this way, the rollers are kept in contact with the cam tracks with absolutely no clearance by using the spring-back of the weak auxiliary arm provided the position of the pivoting pin of the lever is selected relative to the cam plates in such a way that the rollers are continually in contact with the cam tracks under a slight contact pressure. As long as the rollers are in contact with the cam tracks without clearance, an additional vibration excitation due to cam clearance cannot occur and this is ensured for a longer period with an auxiliary arm of the lever which is weaker because in this case, the spring deflection of the sprung contact of the roller of the auxiliary arm becomes larger and a longer period therefore elapses before the lever has to be readjusted or replaced in order to avoid cam clearance.

The use of cam plates which are followed externally permits a further advantageous development of the invention which consists in the fact that at least the first rollers which transmit the forces during the working stroke—and preferably also the second rollers which transmit the forces during the idle stroke—are supported in their lever at both ends rather than just one. This makes the lever and roller arrangement particularly stiff and, in consequence, the actuation of the tools and the processing carried out by them becomes particularly precise.

In an advantageous further development of the invention, the levers are supported in bearing blocks which can be displaced parallel to the axis of the cam tracks, preferably along the clamping plate. By this means, the tool stations can be conveniently adjusted along the clamping plate; the cam plates are, of course, correspondingly displaceable along the shaft on which they are fastened. The levers can be removed, together with their bearing blocks, at right angles to their lateral clamping surface on the workpiece clamping plate for setting up and stripping down operations.

The cam track and the complementary cam track which are followed by one lever and the cam track and the complementary cam track which are followed by the other lever are preferably coaxial but they could be located on two separate and mutually parallel axes and be driven synchronously.

The idea of the invention can also be carried over to machine tools in which one movable tool half (punch) works against a fixed tool half (die) so that only one lever and one pair consisting of cam track and complementary cam track is required.

WAYS OF CARRYING OUT THE INVENTION

The attached drawings are used for further explanation of the invention.

Figure 2:
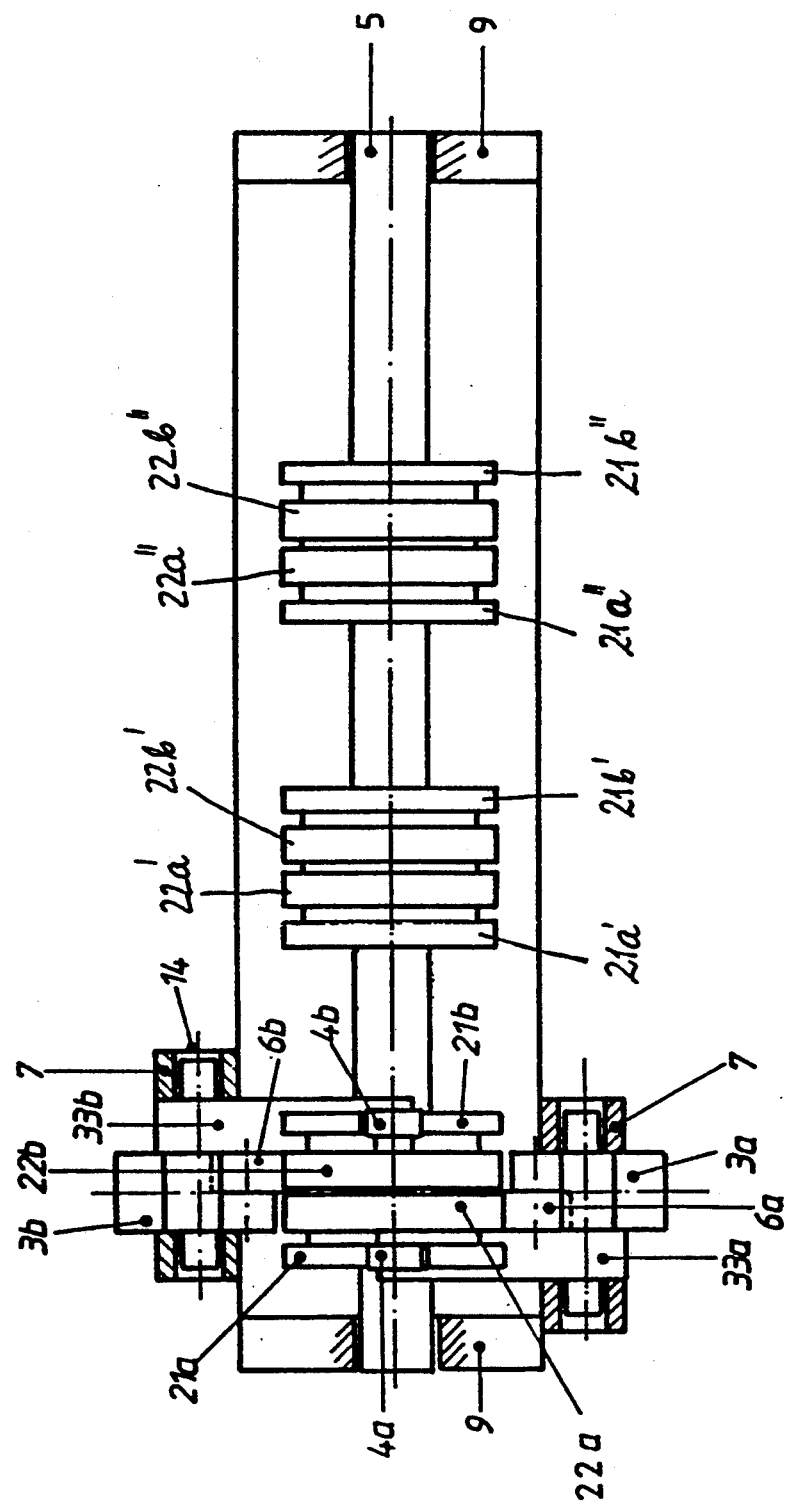
Figure 3:
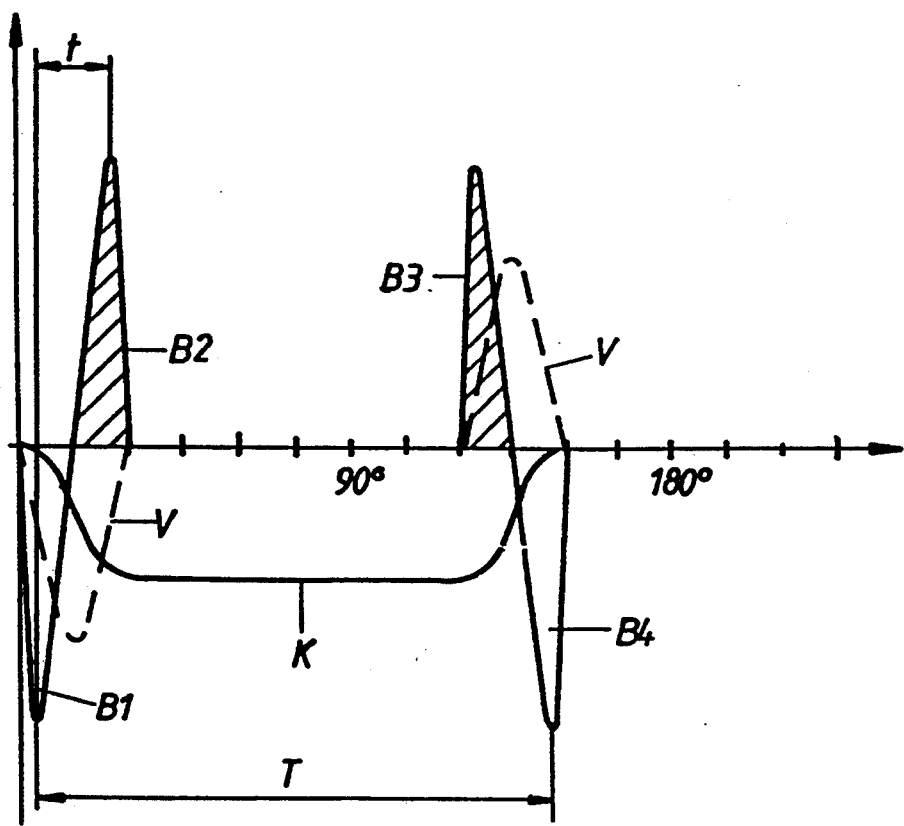
Figure 4:
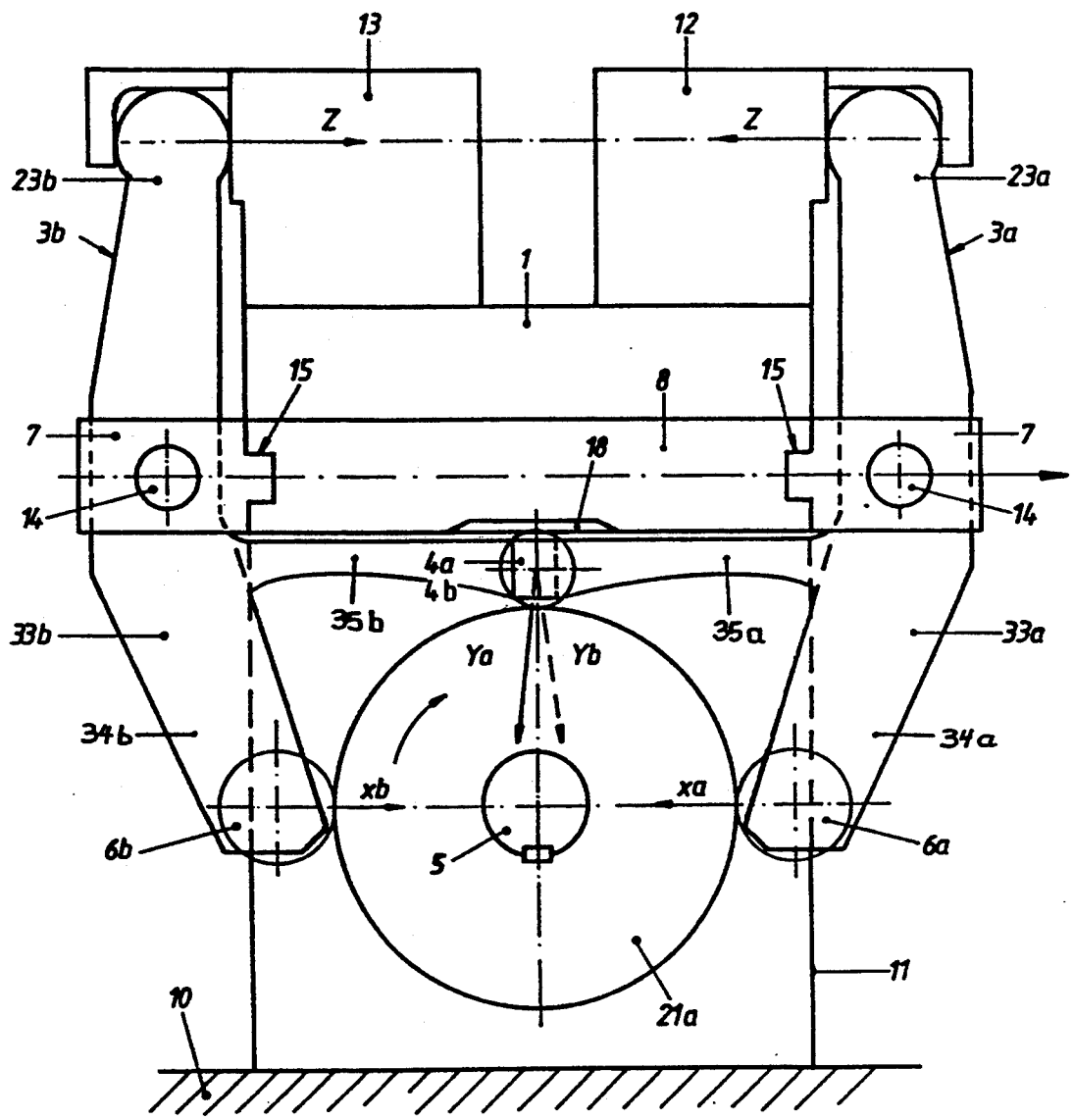
Figure 5:
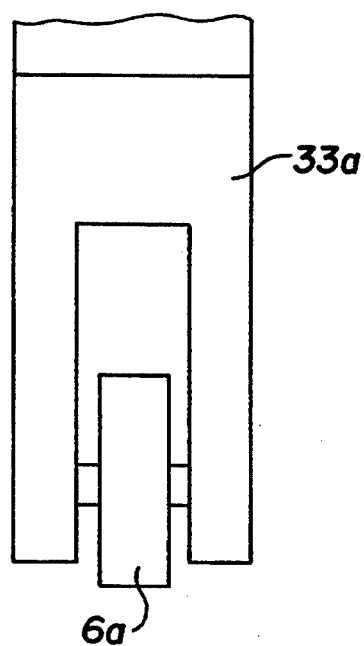

FIG. 1 shows, diagrammatically, the arrangement of a cam gear and a tool clamping plate with tool clamping device in a machine tool, viewed in the direction of the driving shaft of the cam gear, FIG. 2 shows, diagrammatically and partially in section, the plan view on the arrangement of FIG. 1 with the clamping plate removed, FIG. 3 shows an acceleration diagram, FIG. 4 shows an arrangement as in FIG. 1 but with a modified lever configuration and FIG. 5 shows, as detail, the support of a roller in its lever at both ends.

The casing 11 of a cam gear, which is closed towards the top by a horizontal clamping plate 8, is attached to a machine frame 10. The processing tools are clamped on the clamping plate 8. The tools consist of two tool halves 12 and 13 operating against one another and which are guided oppositely and towards one another in the horizontal direction Z by the tool guide 1. In order to reciprocate them, two two-arm levers 3a and 3b act on them, these levers being supported in bearing blocks 7 so that they can be pivoted about horizontal pins 14. These bearing blocks 7 are connected to the clamping plate 8 by a groove and key connection 15 and can be displaced in their longitudinal direction. The respective upper arms 23a and 23b of the levers are connected to the tool halves 12 and 13. The lower arms 33a and 33b of the levers each branch into two sections which respectively carry at their ends a first larger roller 6a or 6b and a smaller roller 4a or 4b which are in contact with cam tracks which are formed on the end surface of cam plates. The cam plates are fastened to a common shaft 5 centrally located below the clamping plate 8. The roller 6a is in contact with a cam plate 22a, the roller 6b is in contact with a cam plate 22b, the roller 4a is in contact with a cam plate 21a and the roller 4b is in contact with a cam plate 21b. These four cam plates could also be replaced by a single cam plate with four cam tracks configured on its circumferential surface. The rollers 4a and 4b are located directly below the clamping plate 8 and protrude partially into a recess 18 of the clamping plate; relative to the shaft 5, they are also located in an approximately 90° position with respect to the rollers 6a and 6b which are located diametrically opposite to one another approximately at the level of the shaft 5. The cam track of the cam plate 21a is complementary to the cam track of the cam plate 22a and is offset relative to the latter by approximately 90° in the peripheral direction. The cam plate 21b has, correspondingly, a cam track which is complementary to the cam track of the cam plate 22b and is offset relative to the latter by approximately 90° in the peripheral direction. Because of the type of arrangement selected, the rollers 4a, 4b and 6a, 6b are guided practically without clearance on the cam tracks 21a, 21b, 22a and 22b and the levers 3a and 3b are optimally short.

So that several processes can be carried out simultaneously in the machine tool, three tool positions are provided and, in other embodiment examples, more than three tool positions can also be provided; there are, correspondingly, three groups of cam plates on the shaft 5 supported in the casing walls 9 and these are preferably displaceable on the shaft 5.

The levers 3a and 3b are similar and are symmetrically arranged opposite to one another. The two rollers 4a and 6a (or 4b and 6b) of each lever 3a (or 3b) provide, by interaction with the bearing support of the lever on its pin 14, a positive connection to the respective cam plate pair 21a and 22a or 21b and 22b.

In order to keep the inertia torque (and therefore the inertia forces) due to the levers 3a and 3b small during acceleration, the levers are made as short as possible, the lower arms 33a and 33b of the two levers being arranged as close as possible below the clamping plate 8 and the rollers 4a and 4b being made small—in any event smaller than the rollers 6a and 6b which have to transmit the processing forces. The small rollers 4a and 4b are only subject to the loads due to the inertia forces of the lever 3a or 3b occurring during the acceleration and the reduced mass of the moving parts of the tool suspended from it. Because of the arrangement of the rollers 4a and 4b vertically above the shaft 5, the acceleration forces accepted by them, which depend on the cam rise angle, are introduced substantially vertically into the machine frame and on into the ground. Because of the large frame mass involved and the good damping of the masses at the bottom, the acceleration amplitude is greatly reduced and the machine is therefore no longer so strongly excited to vibration. On the contrary, it runs very much smoother which leads, on the one hand, to less wear and, on the other, to increased precision during operation because the workpieces and the tools are seated more statically. The support for the operating forces in the tools is undertaken by the rollers 6a and 6b via the closely adjacent cam plates 22a and 22b which are wider than the complementary cam plates 21a and 21b. With respect to the operating forces, there is a closed force path from the workpiece via the tool half 12, the lever 3a, the roller 6a, the cam plates 22a and 22b, the roller 6b, the lever 3b and the tool half 13 back to the workpiece. The clamping plate 8 is loaded in tension only via the pivoting pins 14 of the levers and is not subject to any deformation.

Using the example of a cam shape K extending over a peripheral angle of 150°, FIG. 3 shows, diagrammatically, the variation with time of the velocity V and the acceleration B on a lever between the cam plate and the tool. When a tool half is driven in the direction Z onto a workpiece, the large roller 6a or 6b experiences an acceleration B1 but the braking of the driving-in motion is undertaken by the small roller 4a or 4b and it then experiences the deceleration B2. During the return motion of the tool, in contrast, the smaller roller 4a or 4b is first loaded and experiences the acceleration B3 whereas the braking of the return motion takes place by means of the larger roller 6a or 6b and this experiences the deceleration B4. Because the smaller roller 4a or 4b introduces the acceleration forces approximately vertically downwards (direction Ya or Yb in FIG. 1) via the frame 10 into the ground and, by this means, makes them almost harmless, only the acceleration forces which are transmitted by the large roller 6a and 6b have to be taken into consideration for vibration excitation in the plane of the clamping plate 8. The time base for the vibration excitation is provided by the time interval between the maxima of B1 and B4. If, however, as in the present state of the art, the smaller rollers 4a and 4b were not present, the acceleration forces accepted by them must also be accepted and transmitted by the rollers 6a and 6b; they would then also contribute to vibration excitation in the plane of the clamping plate 8 and, in fact, with a time base corresponding to the distance between the maxima of B1 and B2 and of B3 and B4, which is very much smaller than the distance between the maxima of B1 and B4. In consequence, the excitation frequencies according to the invention are lower by a multiple than the excitation frequencies of the present state of the art, which is very desirable.

It should also be pointed out, as may be seen from FIG. 1, that in the arrangement selected for the small rollers 4a and 4b—located centrally above the cam plate and close beneath the clamping plate 8—the sideways removal of the levers 3a and 3b at right angles to the clamping surface of the bearing blocks 7 is easily possible, thus ensuring good accessibility to the cam gear and facilitating its adjustment.

The embodiment example of FIG. 4 differs from that in FIG. 1 in that the arms 33a and 33b of the levers 3a and 3b are branched into a strong main arm 34a or 34b and into an auxiliary arm 35a or 35b which is substantially weaker relative to the main arm 34a or 34b. Each of the main arms 34a or 34b carries the first roller 6a or 6b for transmitting the forces during the working stroke. Each of the auxiliary arms 35a and 35b carries the smaller roller 4a or 4b for transmitting the forces during the idle stroke. Because the auxiliary arm is very much weaker than the main arm, the auxiliary arm 35a or 36a can spring back somewhat when the two rollers 6a and 4a or 6b and 4b are run on their cam plates under some pressure. Because of the small spring deflection of the auxiliary arm, which does not substantially increase the driving torque, absolutely clearance-free coupling between the cam plates 21a, 21b, 22a, 22b and the rollers 6a, 6b, 4a, 4b is achieved.

As is shown in FIG. 5, it is useful for the main arm 34a or 34b to be configured in fork-shape and to support the roller 6a or 6b at both ends so that the arrangement made up of lever 3a or 3b and roller 6a or 6b is extremely stiff.

In the embodiment example of FIG. 1 or FIG. 4, one of the tool halves, for example the tool half 13, can be stationary. The lever 3b and the associated cam plates 21b and 22b are then omitted. This machine also runs very smoothly even though the shaft 5 is more strongly loaded to one side.

Commercial Application

The invention is particularly suitable for machine tools for the punching and shaping of the lead-outs of integrated circuits which are supplied to the machine tool supported in a metallic carrier strip (lead frame).

We claim:

1. Machine tool with tools for carrying out punching, cutting, embossing and shaping work, the tools driven along a tool guide (1), comprising:
   two two-arm levers (3a, 3b) pivotably supported on a clamping plate (8), each two-arm lever having an upper arm (23a, 23b) connected to an operating tool (12, 13) disposed on the tool guide (1), each two-arm lever having a lower arm (33a, 33b) carrying a first freely rotating roller (6a, 6b), wherein the first roller (6a) of one lower arm is in contact with a first cam track on a first cam (22a) and the first roller (6b) of the other lower arm is in contact with a second cam track on a second cam (22b), both first rollers (6a, 6b) located approximately diametrically with respect to an axis of the cam tracks and approximately parallel to a direction of motion (Z) of the tool;
   third and fourth cam tracks on third and fourth cams 21a, 21b, the third and fourth cam tracks complementary to the first and second cam tracks; and
   a second freely rotating roller (4a, 4b) disposed on the lower arm 33a, 33b of each two-arm lever, wherein the second roller (4a) of one lower arm is in contact with the third cam track (21a), and the second roller of the other lower arm is in contact with the fourth cam track (21b) the second rollers (4a, 4b) located between the axis of the cam tracks and the clamping plate (8).

2. Machine tool with tools for carrying out punching, cutting, embossing and shaping work, the tools driven along a tool guide, (1) comprising:
   a two-arm lever (3a or 3b) pivotably supported on a clamping plate (8), the two-arm lever having a first arm (23a or 23b) connected to a movable tool (12 or 13) disposed on the guide tool (1), the two-arm lever having a second arm (34a, or 34b) that carries a first freely rotating roller (6a or 6b) the first roller (6a or 6b) is in contact with a cam track of a cam (22a or 22b); and
   a second cam track on a second cam (21a or 21b) the second cam track complementary to the first cam track; and
   a second, freely rotating roller (4a or 4b) disposed on a third arm (35a or 35b) of the two-arm lever, the second roller in contact with the second complementary cam track the second roller (4a or 4b) located between the an axis of the cam tracks and the clamping plate.

3. Machine tool according to claim 1, characterised in that the clamping plate (8) is a tie-rod fixed relative to a frame.

4. Machine tool according to claim 1, characterised in that the clamping plate (8) is disposed between the second roller (4a, 4b) and the tool guide (1).

5. Machine tool according to claim 1, characterised in that the second roller (4a, 4b) is located on the axis of the cam tracks at a 90° position relative to the first roller (6a, 6b).

6. Machine according to claim 1, characterised in that the second roller (4a, 4b) is smaller in diameter than the first roller (6a, 6b).

7. Machine according to claim 3, characterised in that the clamping plate (8) is a tie-rod on which the two-arm levers (3a, 3b) are pivotably supported.

8. Machine according to claim 3, characterised in that the tie-rod (8) extends horizontally.

9. Machine according to one of claim 4, characterised in that the second rollers (4a, 4b) are immediately adjacent to the clamping plate (8).

10. Machine according to one of claim 4, characterised in that the clamping plate (8) has a recess (18) into which the second rollers (4a, 4b) protrude.

11. Machine according to claim 1, characterised in that the two-arm levers (3a, 3b) are supported in bearing blocks (7) which can be displaced parallel to the axis of the cam tracks along the clamping plate (8).

12. Machine according to claim 1, characterised in that the lower arm (33a, 33b) is branched into a main arm (3a, 3b) carrying the first roller (6a, 6b) and a second auxiliary arm (35a, 35b) which carries the second roller (4a, 4b) the auxiliary arm (35a, 35b) is weaker than the main arm (3a, 3b).

13. Machine according to claim 12, characterised in that the first and second rollers (6a, 6b, 4a, 4b) are in contact without clearance on the cam tracks.

14. Machine according to claim 1, characterised in that at least the first roller (6a, 6b), and the second roller (4a, 4b), are supported at both ends.

15. Machine according to claim 1, characterised in that the cam tracks have a common axis (5).

16. Machine tool according to claim 2, characterised in that the clamping plate (8) is a tie-rod fixed relative to a frame.

17. Machine tool according to claim 2, characterised in that the clamping plate (8) is disposed between the second roller (4a or 4b) and the tool guide (1).

18. Machine tool according to claim 2, characterised in that the second roller (4a or 4b) is located on the axis of the cam tracks at a 90° position relative to the first roller (6a or 6b).

19. Machine according to claim 2, characterised in that the second roller (4a or 4b) is smaller in diameter than the first roller (6a or 6b).

20. Machine according to claim 16, characterised in that the clamping plate (8) is the tie-rod on which the two-arm lever (3a or 3b) is pivotably supported.

21. Machine according to claim 16, characterized in that the file-rod (8) extends horizontally.

22. Machine according to claim 17, characterised in that the clamping plate (8) has a recess (18) into which the second roller (4a or 4b) protrudes.

23. Machine according to claim 2, characterised in that the two-arm lever (3a or 3b) is supported in bearing blocks (7) which can be displaced parallel to the axis of the cam tracks along the clamping plate (8).

24. Machine according to claim 2, characterised in that the second arm (33a or 33b) is branched into a main arm (3a or 3b) carrying the first roller (6a or 6b) and a second auxiliary arm (35a or 35b) which carries the second roller (4a or 4b), the auxiliary arm (35a or 35b) is weaker than the main arm 3a or 3b).

25. Machine according to claim 24, characterised in that the first and second rollers (6a or 6b, 4a or 4b) are in contact without clearance on the cam tracks.

26. Machine according to claim 2, characterised in that at least the first roller (6a or 6b) and the second roller (4a or 4b) are supported at both ends.

27. Machine according to claim 2, characterised in that the cam tracks have a common axis (5).

28. Machine according to claim 5, characterised in that the second roller (4a or 4b) is smaller in diameter than the first roller (6a or 6b).

29. Machine according to claim 18, characterised in that the second roller (4a or 4b) is smaller in diameter than the first roller (6a or 6b).

30. Machine according to claim 28, characterised in that the clamping plate (8) has a recess (18) into which the second roller (4a or 4b) protrudes.

31. Machine according to claim 29, characterised in that the clamping plate (8) has a recess (18) into which the second roller (4a or 4b) protrudes.

* * * * *